(12) United States Patent
Wu et al.

(10) Patent No.: US 10,388,588 B2
(45) Date of Patent: Aug. 20, 2019

(54) HEAST SINK FASTENING SEAT FOR USE WITH ELECTRICAL CONNECTOR

(71) Applicant: FOXCONN INTERCONNECT TECHNOLOGY LIMITED, Grand Cayman (KY)

(72) Inventors: Heng-Kang Wu, Shenzhen (CN); Fu-Jin Peng, Shenzhen (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/137,560

(22) Filed: Sep. 21, 2018

(65) Prior Publication Data
US 2019/0088572 A1 Mar. 21, 2019

(30) Foreign Application Priority Data
Sep. 21, 2017 (CN) .......................... 2017 1 0859724

(51) Int. Cl.
| H01R 12/00 | (2006.01) |
| H01L 23/40 | (2006.01) |
| H05K 1/18 | (2006.01) |
| H01R 12/70 | (2011.01) |
| H01R 13/52 | (2006.01) |
| H01R 12/71 | (2011.01) |

(52) U.S. Cl.
CPC ..... *H01L 23/4006* (2013.01); *H01R 12/7076* (2013.01); *H01R 12/716* (2013.01); *H01R 13/5213* (2013.01); *H05K 1/181* (2013.01); H01L 2023/4087 (2013.01); H05K 2201/10189 (2013.01); H05K 2201/10409 (2013.01)

(58) Field of Classification Search
CPC .............. H01L 23/4006; H01R 12/716; H01R 12/7076; H01R 13/5213; H05B 6/6441; G02B 6/4249; G02B 6/3897; H05K 2201/10189; H05K 2201/10409; H05K 1/181; H05K 7/20436; G06F 1/20
USPC .......................................................... 439/68
See application file for complete search history.

(56) References Cited

U.S. PATENT DOCUMENTS

| 2003/0091301 A1* | 5/2003 | Lee ....................... G02B 6/4249 385/89 |
| 2011/0205710 A1* | 8/2011 | Kondo ............... H05K 7/20436 361/714 |

(Continued)

FOREIGN PATENT DOCUMENTS

| CN | 205212058 U | 5/2016 |
| CN | 106711685 A | 5/2017 |

*Primary Examiner* — Jean F Duverne
(74) *Attorney, Agent, or Firm* — Wei Te Chung; Ming Chieh Chang

(57) ABSTRACT

An electrical connector assembly includes an electrical connector mounted upon a printed circuit board, and a heat sink fastening seat mounted upon the printed circuit board and beside the connector. The heat sink fastening seat includes a pair of metallic mounting bars spaced from each other and located by two lateral sides of the connector in the transverse direction. A pair of alignment posts are formed on the corresponding mounting bars, respectively. A pair of metallic spring blades are respectively, in the vertical direction, aligned with and mounted upon the corresponding mounting bars for cooperation with the corresponding components of the heat sink for fastening.

13 Claims, 8 Drawing Sheets

(56) References Cited

U.S. PATENT DOCUMENTS

| | | | | |
|---|---|---|---|---|
| 2013/0155611 A1* | 6/2013 | Yang | ......................... | G06F 1/20 |
| | | | | 361/692 |
| 2015/0381952 A1* | 12/2015 | Yusa | .................... | H04N 9/3144 |
| | | | | 353/52 |
| 2018/0031788 A1* | 2/2018 | Duran | ................... | G02B 6/3897 |
| 2018/0098389 A1* | 4/2018 | Kamiya | ............... | H05B 6/6441 |

* cited by examiner

US 10,388,588 B2

HEAST SINK FASTENING SEAT FOR USE WITH ELECTRICAL CONNECTOR

BACKGROUND OF THE DISCLOSURE

1. Field of the Disclosure

The present disclosure relates to the heat sink fastening seat, and particularly to the fastening seat for use with the electrical connector receiving therein a CPU (Central Processing Unit) on which the heat sink is mounted.

2. Description of Related Arts

China Invention Patent No. CN106711685 discloses an electrical connector surrounded by a U-shaped heat sink fastening seat, and a pair of metallic spring blades mounted upon two opposite arms of the fastening seat. A metallic back plate cooperates with the fastening seat to sandwich between a printed circuit board on which the connector is mounted. Understandably, it requires to replace the whole U-shaped fastening seat even if only one arm and the corresponding spring blade are damaged. In addition, the U-shaped configuration of the fastening seat takes too much material on the raw metallic plate for manufacturing, and wastes too much material.

An improved heat sink fastening seat is desired.

SUMMARY OF THE DISCLOSURE

Accordingly, an object of the present disclosure is to provide an electrical connector assembly including an electrical connector mounted upon a printed circuit board, and a heat sink fastening seat mounted upon the printed circuit board and beside the connector. The heat sink fastening seat includes a pair of metallic mounting bars spaced from each other and located by two lateral sides of the connector in the transverse direction. A pair of alignment posts are formed on the corresponding mounting bars, respectively. A pair of metallic spring blades are respectively, in the vertical direction, aligned with and mounted upon the corresponding mounting bars for cooperation with the corresponding components of the heat sink for fastening.

A detachable dust cover is attached upon the spring blades via corresponding locking pieces to cover the electrical connector in the vertical direction wherein the locking piece extends obliquely to comply with an oblique extension of the spring blade.

Other objects, advantages and novel features of the disclosure will become more apparent from the following detailed description when taken in conjunction with the accompanying drawings.

DETAILED DESCRIPTION OF THE PREFERRED EMBODIMENT

Figure 1:
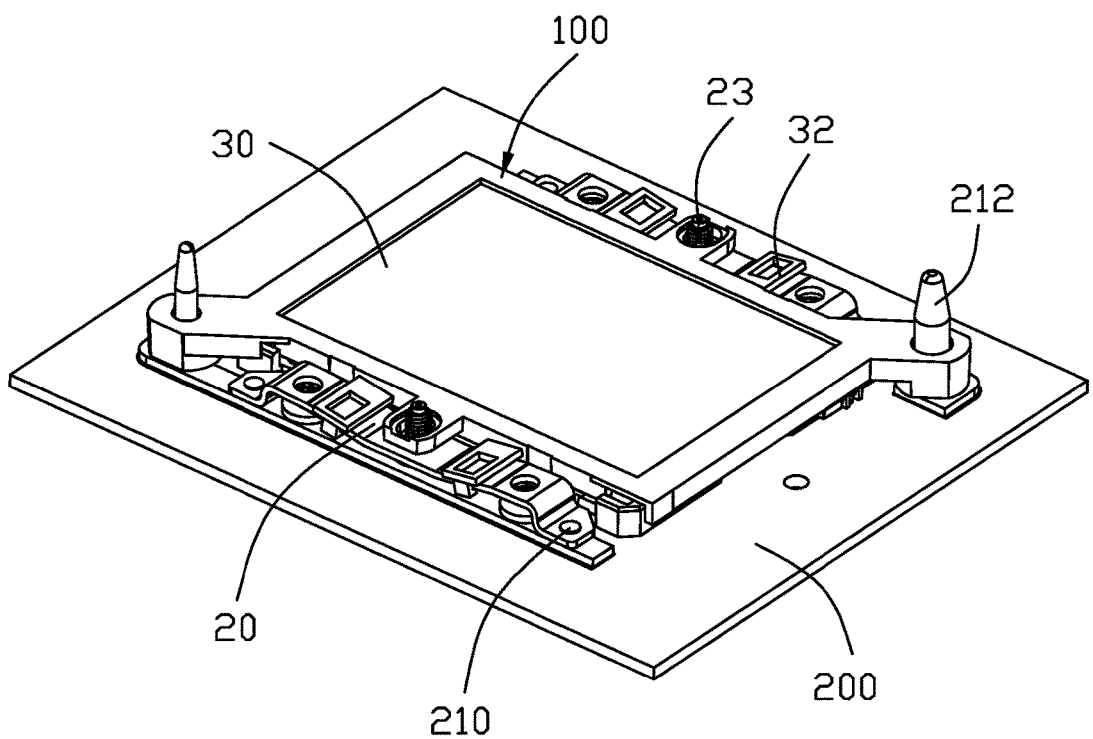
FIG. 1 is a perspective view of the electrical connector assembly mounted upon the printed circuit board according to the invention.

Reference description will now be made in detail to the embodiment of the present disclosure.

Referring to FIGS. 1-8, an electrical connector assembly 100 for connecting a CPU to a printed circuit board 200, includes an electrical connector 10, a fastening seat 20, and a cover 30 attached upon the fastening seat 20 to shielding the electrical connector 10. The connector 10 includes an insulative housing 11 with a plurality of contacts (not shown) retained therein. A receiving cavity 110 is formed within the housing 11 for receiving the CPU therein, and contacting sections of the contacts extend upwardly into the receiving cavity 110 for contacting the CPU. Understandably, the cover 30 is attached to the fastening seat 20 to cover the receiving cavity 110 while is detached therefrom to allow the CPU to be installed into the receiving cavity 110, and a heat sink (not shown) is seated upon the CPU and fastened to the fastening seat 20 by a fastener (not shown).

Figure 2:
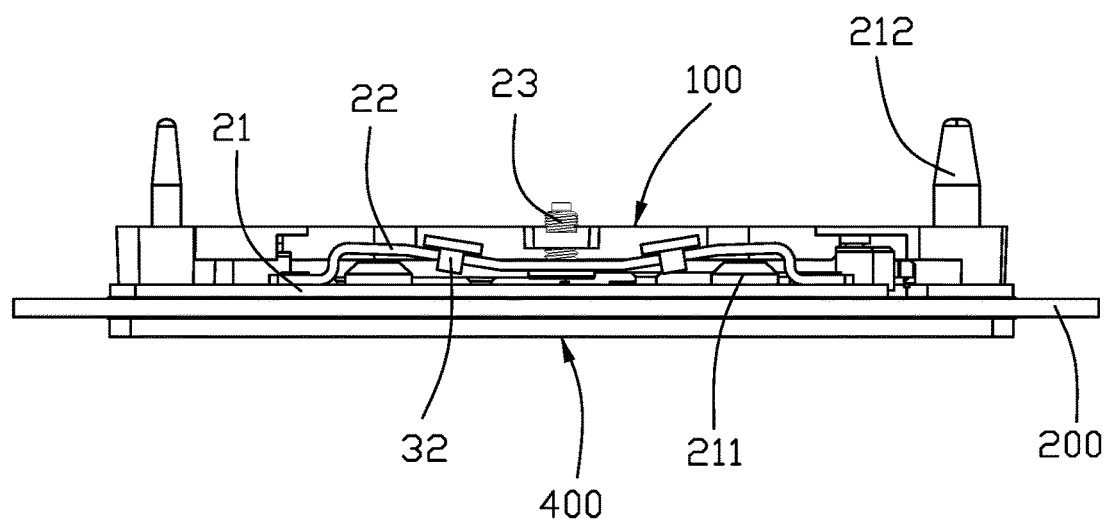
FIG. 2 is a side view of the electrical connector assembly mounted upon the printed circuit board of FIG. 1.
Figure 3:
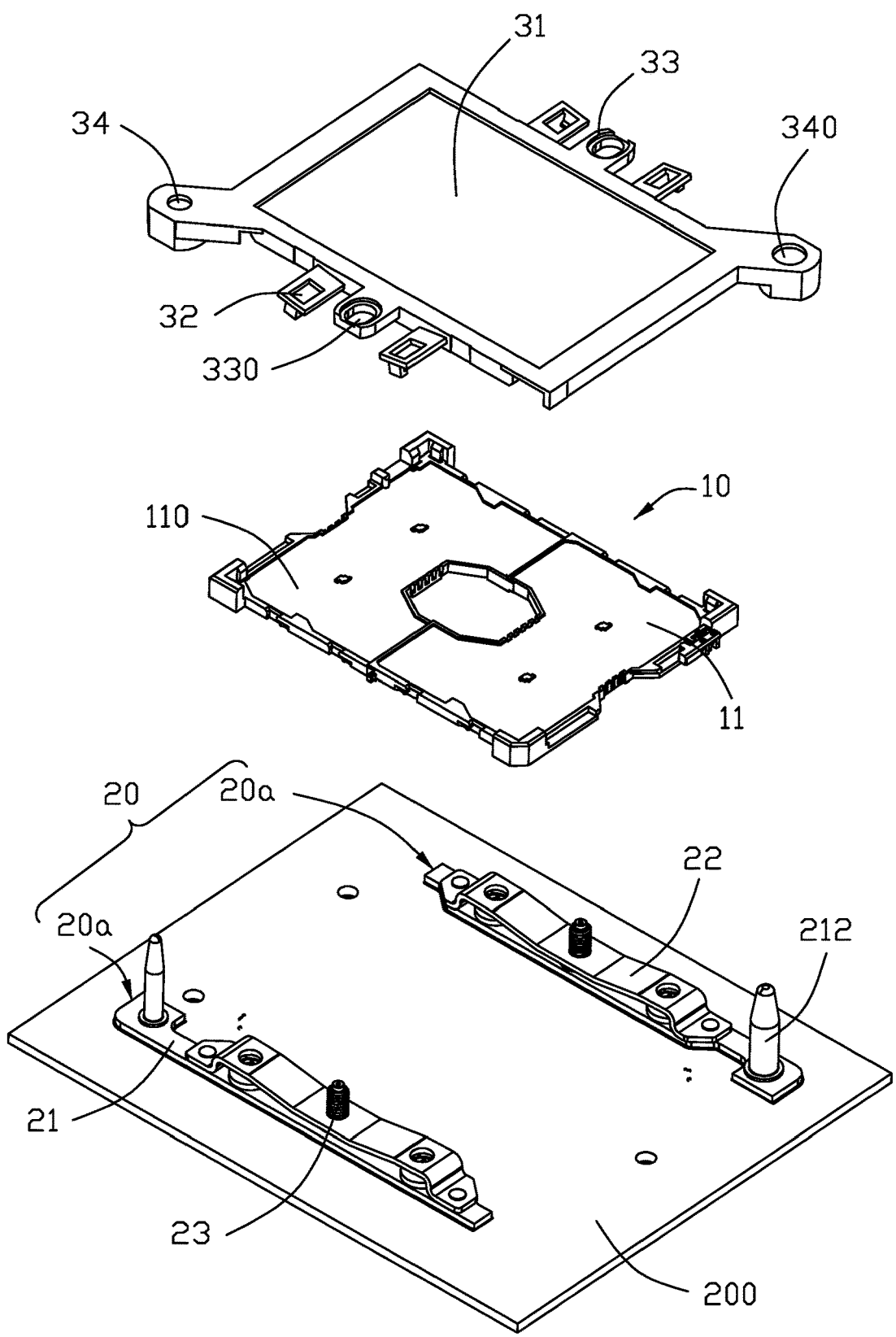
FIG. 3 is an exploded perspective view of the electrical connector assembly mounted upon the printed circuit board of FIG. 1.
Figure 4:
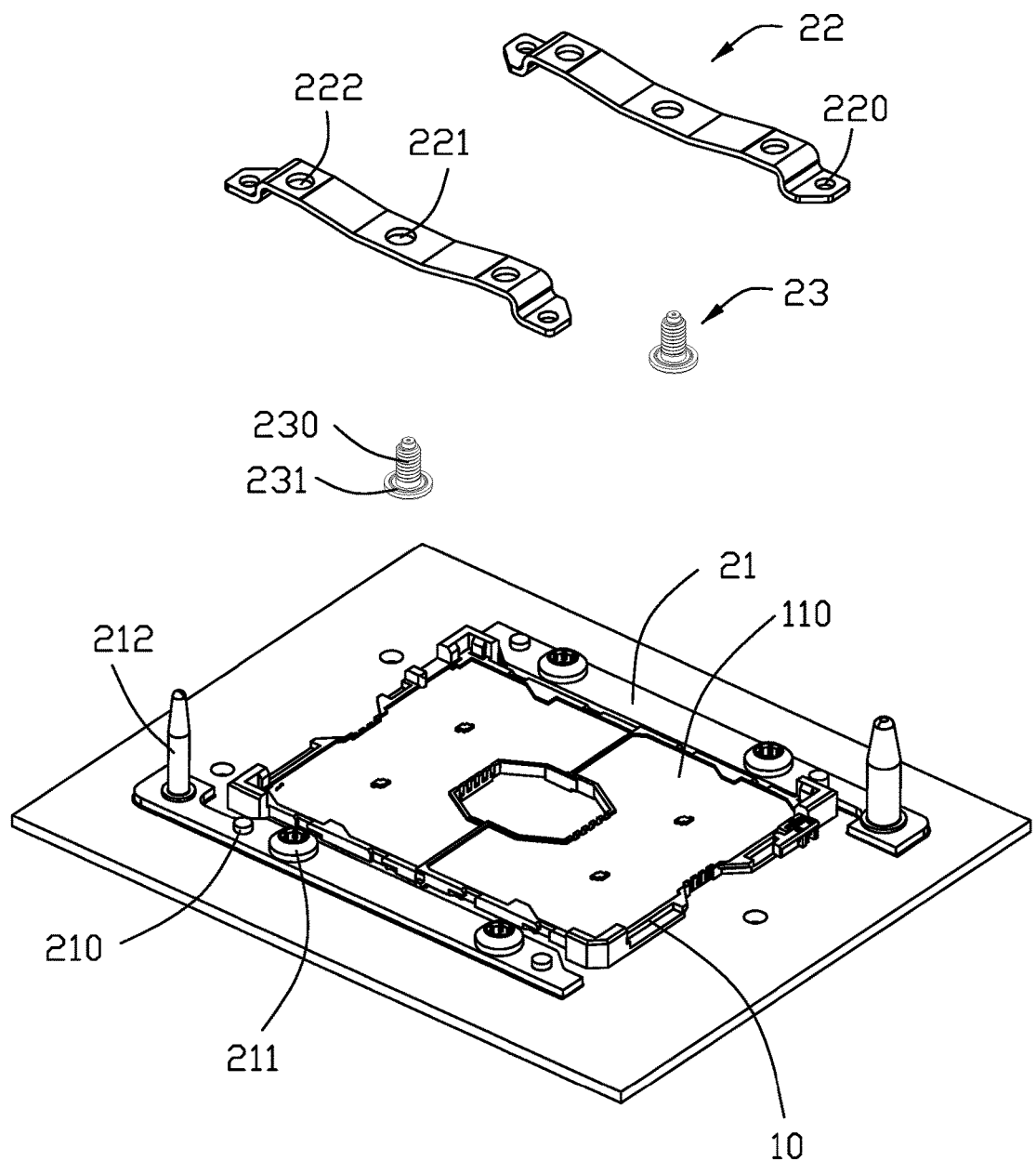
FIG. 4 is an exploded perspective view of a portion of the electrical connector assembly mounted upon the printed circuit board of FIG.
Figure 5:
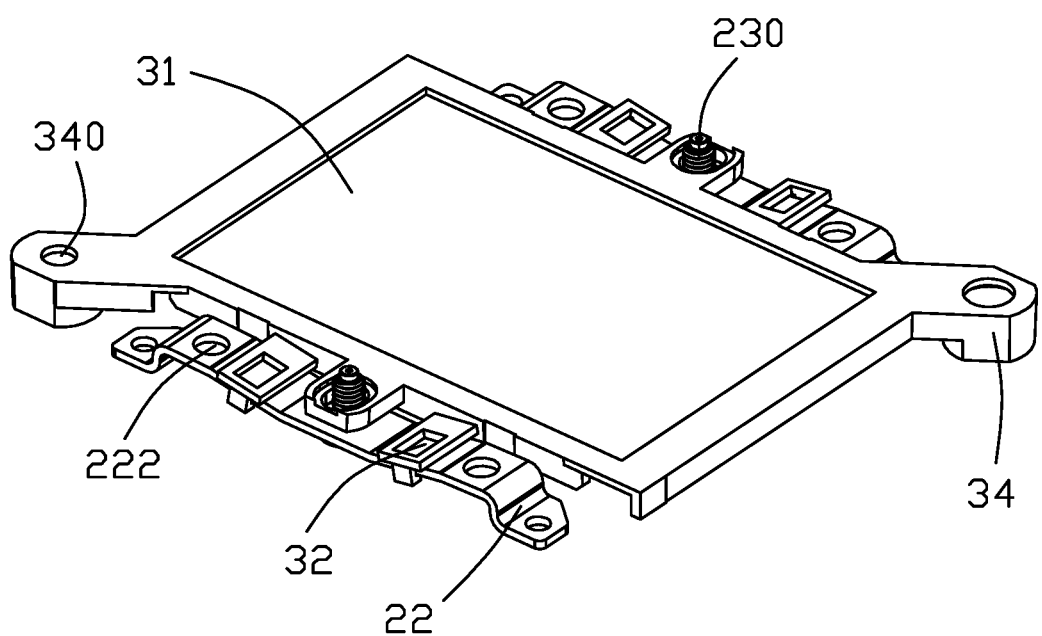
FIG. 5 is an assembled perspective view of the dust cover mounted upon the corresponding spring blades of the electrical connector assembly of FIG. 1.
Figure 6:
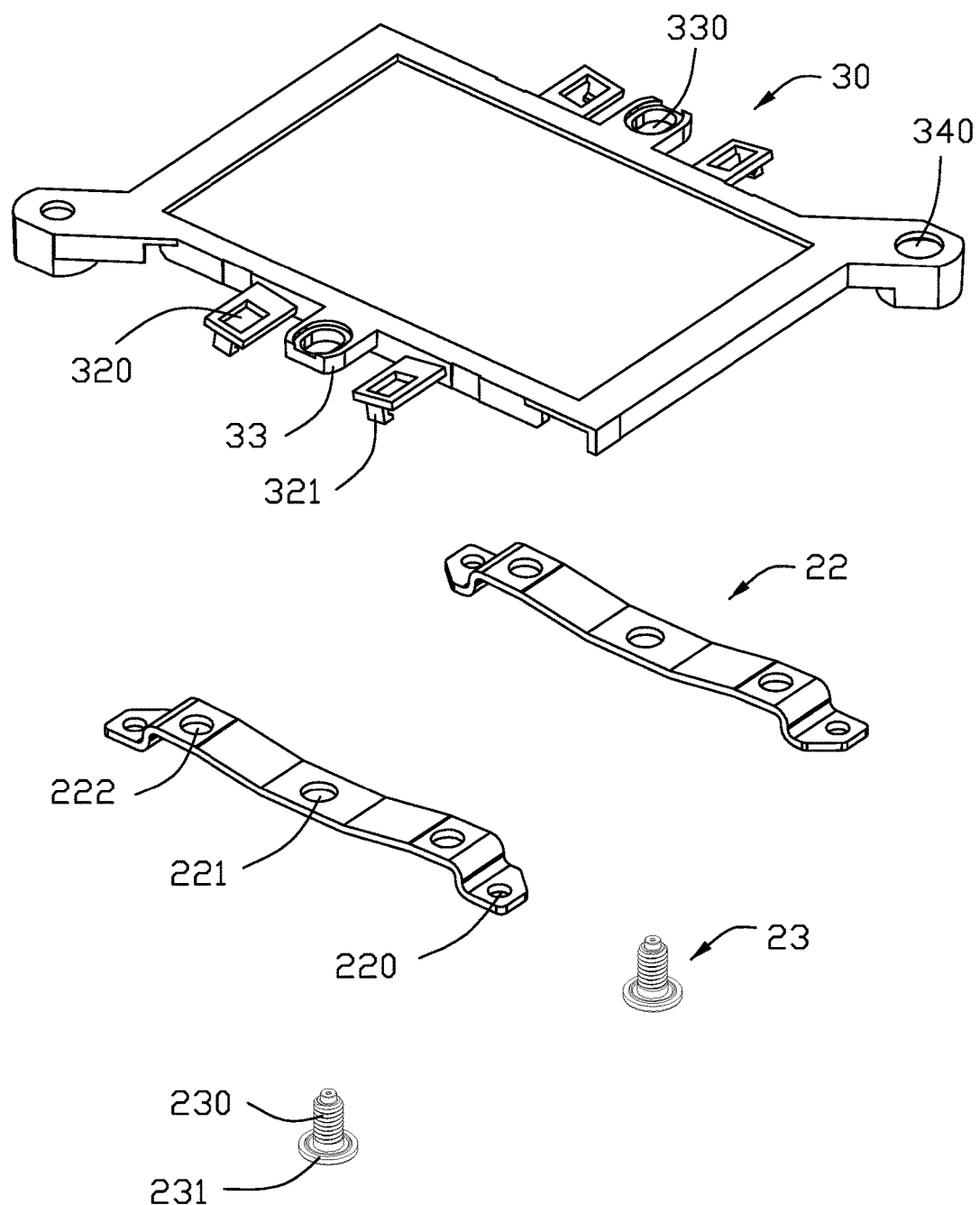
FIG. 6 is an exploded perspective view of the electrical connector assembly of FIG. 5.
Figure 7:
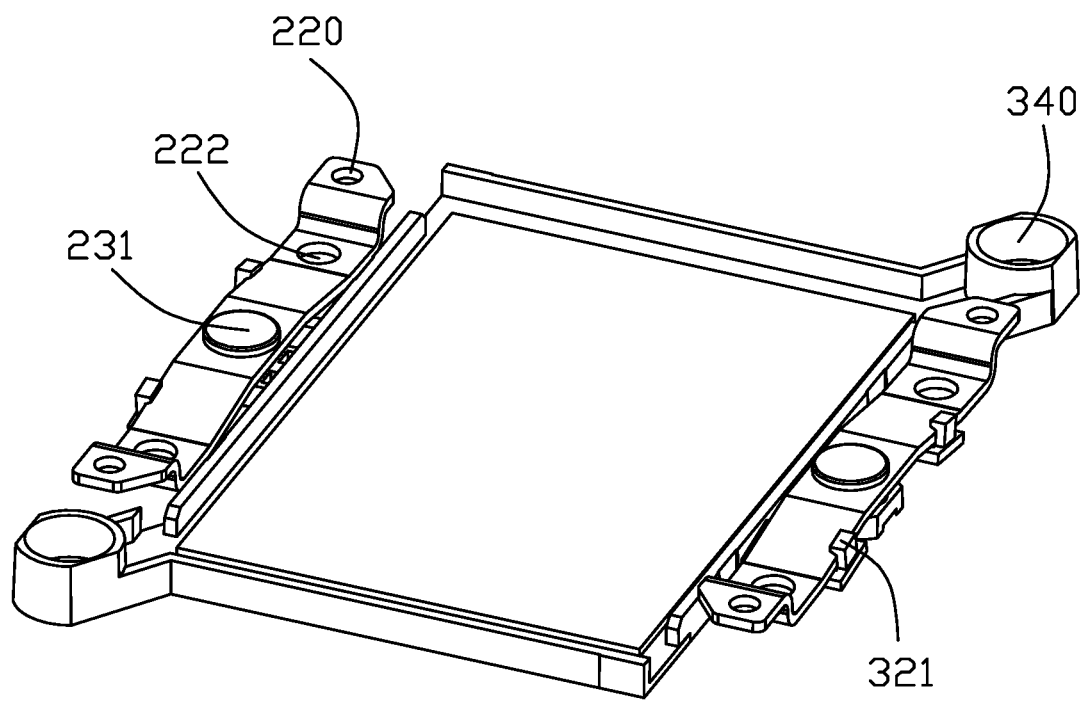
FIG. 7 is an upside-down assembled perspective view of the electrical connector assembly of FIG. 5.
Figure 8:
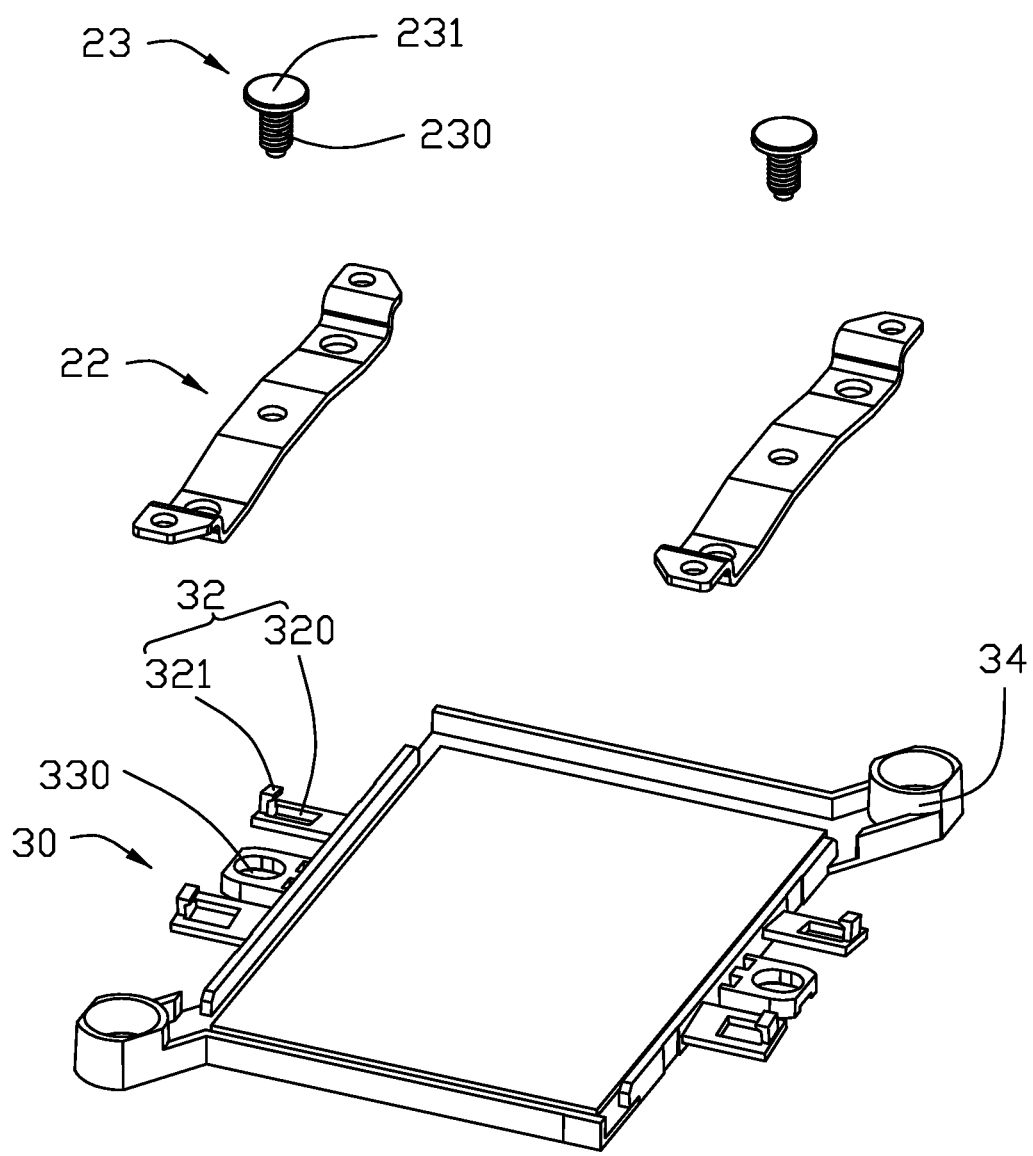
FIG. 8 is an exploded perspective view of the electrical connector assembly of FIG. 7.

The fastening seat 20 includes a pair of parts 20a respectively located by two lateral sides of the housing 11. Each part 20a includes a mounting bar/bracket 21, a spring blade 22 fastened upon the mounting bar 21, and a screw 23 secured upon the spring blade 22. Each part 20a further includes a pair of rivets 210 securing the mounting bar 21 and the spring blade 22 together, and a pair of fixing pieces 211 between the pair of fixing pieces 210 wherein the screw 23 is located between the pair of fixing pieces 211 and includes a thread portion 230 and a head 231 thereunder. The spring blade 22, on which in use the aforementioned fastener of the heat sink is engaged, forms a pair of rivet holes 220 secured with the corresponding rivets 210, a through hole 221 through which the thread portion 230 of the screw 23 upwardly extends, and a pair of operation holes 222 aligned with the fixing pieces 211 As shown in FIG. 2, the mounting bar 21 is secured upon the printed circuit board 200 via engagement between the fixing pieces 211 and the corresponding protrusions (not shown) of a back plate 400 located on an undersurface of the printed circuit board 200 opposite to the mounting bar 21. The pair of parts 20a further include a pair of alignment posts 212 located at two opposite diagonal corners of the housing 11 with different diameters thereof for orientation consideration. In this embodiment, each of the pair of mounting bars 21 is aligned with the housing 11 in the transverse direction with a bottom end terminated around one end wall of the housing 11 and an extended head end terminals beyond the other end wall of the housing 11 so as to form a diagonally/reversely symmetrical manner with regard to the housing 11 as shown in FIG. 4.

The cover 30 includes a main body or plate 31, two pairs of locking sections 32 on two opposite lateral sides, a pair of ears 33 each between the corresponding pair of locking section 32, and a pair of diagonal extensions 34. The locking section 32 includes a horizontal section 320 and a hook 321 extending downwardly from the horizontal section 320. The hook 321 is engaged with the spring blade 32, the ear 33 forms a through hole 330 through which the thread portion 230 of the screw 23 already extending through the through hole 221, upwardly extends. The diagonal extensions 34 forms differently dimensioned holes 340 to compliantly receive the corresponding differently dimensioned alignment holes 212.

In assembling, in each part 20a, the spring blade 22 is pre-assembled to the corresponding mounting bar 21 via rivets 210 engaged with the rivet holes 220. The pair of mounting bars 21 are further mounted upon an upper surface of the printed circuit board 200 via engagement between the fixing pieces 211 and the upward protrusions (not shown) of the back plate 400 extending through the printed circuit board 200 so as to have the printed circuit board 200 sandwiched between the back plate 400 and the mounting bars 21 in the vertical direction. The electrical connector 10 is mounted upon the printed circuit board 200 and between the pair of parts 20a of the fastening seat 20 in the transverse direction wherein the pair of alignment posts 212 are located around two opposite diagonal corners of the housing 11. Notably, the operation holes 222 allows the tool to extend therethrough to rotate the fixing piece 211 for fastening. Finally, the cover 30 is downwardly assembled upon the housing 11 and the pair of parts 20a via engagement between the hooks 32 of the cover 30 and the spring blade 32. The thread portion 230 of the screw 23 extending through the through hole 330 is exposed above the ear 33 and the spring blade 22. Similarly, the alignment posts 212 extending through the holes 340, is exposed above the diagonal extensions 34. Understandably, the cover 30 can be detached from the spring blades 22 to allow a CPU to be loaded into the receiving cavity 110.

The fastening seat 20 using two mounting bars 21 instead of a unitary U-shaped part not only saves raw material with less waste but also allows replacement of only one mounting bar instead of a pair during repairing. In addition, the cover 30 is engaged with the fastening seat on two opposite sides rather than at the corners, thus being reliable and convenient compared with the traditional way disclosed in the aforementioned China Patent No. CN106711685.

What is claimed is:

1. An electrical connector assembly comprising:
a printed circuit board defining opposite top and bottom surfaces in a vertical direction;
an electrical connector mounted upon the top surface of the printed circuit board and including an insulative housing defining a receiving cavity upwardly communicating with an exterior in said vertical direction for receiving a CPU (Central Processing Unit) to a plurality of contacts retained in the housing;
a pair of mounting bars being discrete and spaced from each other in a transverse direction perpendicular to the vertical direction and respectively located by two sides of the housing in said transverse direction and secured to the top surface of the printed circuit board, each of said mounting bars extending along a front-to-back direction perpendicular to both the vertical direction and the transverse direction;
a pair of spring blades secured to the corresponding mounting bars, respectively; wherein
said pair of spring blades are configured to be adapted to be engaged with a heat sink assembly when the CPU is received within the receiving cavity, or a dust cover when no CPU is received within the receiving cavity; wherein the pair of mounting bars respectively forms a pair of alignment posts located at corresponding ends thereof and around two opposite diagonal corners of the housing; wherein said pair of mounting bars are same with each other except the pair of alignment posts of which one is diametrically larger than the other.

2. The electrical connector assembly as claimed in claim 1, wherein each of said spring blades includes a screw having an upward thread portion exposed to an exterior.

3. The electrical connector assembly as claimed in claim 2, wherein said dust cover includes two pairs of locking sections to lock to the spring blades.

4. The electrical connector assembly as claimed in claim 3, wherein the screw is symmetrically located between the corresponding pair of locking sections in the front-to-back direction.

5. The electrical connector assembly as claimed in claim 2, wherein said dust cover includes a pair of ears respectively on two opposite lateral sides thereof, through which the pair of screws extend upwardly.

6. The electrical connector assembly as claimed in claim 1, wherein said dust cover includes two pairs of locking sections respectively located on two opposite lateral sides thereof with corresponding hooks to lock to the spring blades.

7. The electrical connector assembly as claimed in claim 3, wherein each of the locking sections extends in an oblique direction to comply with a corresponding portion of the spring blade.

8. The electrical connector assembly as claimed in claim 7, wherein said dust cover further includes a pair of ears respectively on said two opposite lateral sides thereof, and each of said ears is symmetrically located between the corresponding pair of locking sections in the front-to-back direction.

9. The electrical connector as claimed in claim 1, further including a back plate attached upon a bottom surface of the printed circuit board and secured to the corresponding pair of mounting bars.

10. A dust cover for use with an electrical connector assembly comprising:
a rectangular main plate defining two opposite lateral sides thereof in a transverse direction;
each of said lateral sides forming a pair of locking sections with an ear therebetween in a front-to-back direction perpendicular to said transverse direction;
each ear forming a hole extending therethrough in a vertical direction perpendicular to both the transverse direction and the front-to-back direction; and
a pair of diagonal extensions located at two opposite corners of the main plate in a diagonal direction; wherein
said pair of diagonal extensions form a pair of diametrically different through holes; wherein the pair of locking sections extend in opposite oblique directions; wherein each of said locking sections includes an downwardly extending hook.

11. An electrical connector assembly comprising:
a printed circuit board defining opposite top and bottom surfaces in a vertical direction;
an insulative housing seated upon the top surface with an upward opening receiving cavity;
a pair of mounting bars being discrete and spaced from each other in a transverse direction perpendicular to the vertical direction, and commonly mounted upon the top surface of the printed circuit board and respectively located by two lateral sides of the housing, each of said mounting bars extending along a front-to-back direction perpendicular to both the vertical direction and the transverse direction;

a pair of spring blades secured to the corresponding pair of mounting blades, respectively; wherein said pair of mounting bars are dimensioned longer than a dimension of the housing in the front-to-back direction and arranged in a diagonally/reversely symmetrical manner with regard to the housing; wherein each of said mounting bars includes a bottom end terminated around one end wall of the housing, and a head end extending beyond the other end wall in the front-to-back direction; wherein each of said mounting bars has an alignment post on the head end; further including a dust cover attached upon the pair of spring blades, wherein said dust cover includes a pair of extensions with corresponding holes to receive the corresponding alignment posts therein, respectively.

12. The electrical connector assembly as claimed in claim 11, wherein said pair of spring blades are configured to be adapted to be engaged with a heat sink assembly.

13. The electrical connector assembly as claimed in claim 12, wherein each of said pair of spring blades is equipped with an upwardly extending screw.

* * * * *